(12) United States Patent
McGrath

(10) Patent No.: US 6,788,136 B2
(45) Date of Patent: Sep. 7, 2004

(54) METHODS AND APPARATUS FOR AMPLIFICATION IN HIGH TEMPERATURE ENVIRONMENTS

(75) Inventor: Donald Thomas McGrath, Fort Collins, CO (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/682,863

(22) Filed: Oct. 25, 2001

(65) Prior Publication Data

US 2003/0080809 A1 May 1, 2003

(51) Int. Cl.[7] .................................................. H03F 1/02
(52) U.S. Cl. ........................ 330/9; 330/253; 330/277; 327/124; 257/77
(58) Field of Search ........................ 330/9, 253, 277; 327/124, 333; 326/81; 257/77

(56) References Cited

U.S. PATENT DOCUMENTS

| 4,558,235 A | * | 12/1985 | White et al. | |
|---|---|---|---|---|
| 4,647,845 A | * | 3/1987 | Richter et al. | |
| 4,912,423 A | | 3/1990 | Milkovic et al. | |
| 5,184,199 A | * | 2/1993 | Fujii et al. | 257/77 |
| 5,286,985 A | | 2/1994 | Taddiken | |
| 5,378,642 A | | 1/1995 | Brown et al. | |
| 5,385,855 A | | 1/1995 | Brown et al. | |
| 5,510,632 A | | 4/1996 | Brown et al. | |
| 5,963,791 A | | 10/1999 | Brown et al. | |
| 6,191,458 B1 | | 2/2001 | Brown et al. | |
| 6,198,114 B1 | | 3/2001 | Blanchard | |
| 6,344,663 B1 | * | 2/2002 | Slater, Jr. et al. | 257/77 |
| 6,380,801 B1 | * | 4/2002 | McCartney | 330/9 |

FOREIGN PATENT DOCUMENTS

JP          58130608       *   8/1983

OTHER PUBLICATIONS

Palmour et al. "High–temperature depletion—mode metal–oxide–semiconductor field–effect transistors in beta–SiC thin films" Appl. Phys. Lett. 51, Dec. 14, 1987 pp 2028–2030*

Schmid et al. "Process technology and high tempereture performance of 6H–SiC MOS devices" The Third European Conference on High temperature Electronics 1999 pp195–199.*

* cited by examiner

Primary Examiner—Michael B. Shingleton
(74) Attorney, Agent, or Firm—Robert B. Reeser, III; Armstrong Teasdale LLP

(57) ABSTRACT

In one aspect, the present invention provides a method for amplifying a signal including generating an input signal and amplifying the input signal utilizing a chopper-stabilized, silicon carbide NMOS depletion mode operational amplifier to produce an amplified output signal.

14 Claims, 4 Drawing Sheets

METHODS AND APPARATUS FOR AMPLIFICATION IN HIGH TEMPERATURE ENVIRONMENTS

FEDERAL RESEARCH STATEMENT

The U.S. Government has a paid-up license in this invention and the right in limited circumstances to require the patent owner to license others on reasonable terms as provided for by the terms of United States Department of Defense Air Force Contract No. 1-33615-94-C-2417.

BACKGROUND OF INVENTION

This invention relates generally to methods and apparatus for amplification and signal processing at elevated temperatures, and more particularly to methods and apparatus for chopper stabilized amplification at high temperatures.

Amplification and signal processing of signals from sensors in high temperature environments are difficult tasks due to the failure of silicon devices to operate above 200 degrees Celsius. Amplifiers utilizing silicon carbide (SiC) semiconductors have been demonstrated, and SiC material itself is capable of operation at temperatures beyond 500 degrees Celsius. However, oxide interfaces in SiC metal on semiconductor (MOS) devices used in amplifiers contain many interface states, which introduce large random offsets that change as a function of temperature. The resulting amplifier offset drift makes it difficult to accurately amplify small sensor signals.

Techniques are known for offset drift reduction in amplifiers implemented with other semiconductor technologies. At least some known techniques include chopper stabilization, continuous offset removal using a second auxiliary amplifier, and correlated double sampling. However, these techniques have not been practical for amplifiers utilizing SiC technology and other negative-channel metal-oxide semiconductor (NMOS) depletion mode technologies. Circuits in SiC technology with large numbers of transistors are subject to low yields due to micropipes and other material defects. Silicon carbide positive-channel MOS (PMOS) devices have low mobility, thus making it impossible to provide complementary circuits with switches. At present, depletion mode NMOS transistors are viable and reliable, but the negative thresholds of NMOS depletion mode transistors have complicated adaptation of conventional stabilization circuitry to SiC and other NMOS depletion mode processes.

SUMMARY OF INVENTION

There is therefore provided, in one aspect, a method for amplifying a signal including generating an input signal and amplifying the input signal utilizing a chopper-stabilized, silicon carbide NMOS depletion mode operational amplifier to produce an amplified output signal.

In another aspect, there is provided a buffered field effect transistor logic (BFL) level-shifting/inverter circuit having an input, an NMOS depletion mode inverter responsive to the inverter stage input to produce an inverted output, a buffered field effect transistor logic (BFL) stage that includes a first NMOS depletion mode field effect transistor (FET) having a first gate and an associated first channel, a second NMOS depletion mode FET having a second gate and an associated second channel, and a voltage drop circuit electrically connected in series between the first channel and the second channel, a first output at an electrical node between the voltage drop circuit and the first channel, and a second output at an electrical node between the voltage drop circuit and the second channel.

In yet another aspect, there is provided an operational amplifier circuit including a first NMOS depletion mode amplification stage, a first NMOS depletion mode chopping switch responsive to a first chopping signal to chop an input signal to the first amplification stage, a second NMOS depletion mode chopping switch responsive to a level-shifted first chopping signal to chop an output signal from the first amplification stage, and an NMOS depletion mode buffered field effect transistor logic (BFL) level shifting/inverter circuit responsive to a clock signal to generate the first chopping signal and the level shifted first chopping signal across a voltage dropping element.

In still another aspect, there is provided an operational amplifier circuit including a first NMOS depletion mode amplification stage having differential inputs and outputs, a first NMOS depletion mode chopping switch responsive to a first chopping signal and a second chopping signal to chop a differential input signal to the first amplification stage, a second NMOS depletion mode chopping switch responsive to a level-shifted first chopping signal and a level shifted second chopping signal to chop an output signal from the first amplification stage, a first NMOS depletion mode buffered field effect transistor logic (BFL) level shifting/inverter circuit responsive to a clock signal to generate the first chopping signal and the level shifted first chopping signal across a first resistor, a second NMOS depletion mode buffered field effect transistor logic (BFL) level shifting/inverter circuit responsive to the clock signal to generate the second chopping signal and the level shifted second chopping signal across a second resistor, and a clock generator circuit configured to generate the clock signal.

DETAILED DESCRIPTION

As used herein, an element or step recited in the singular and preceded with the word "a" or "an" should be understood as not excluding plural said elements or steps, unless such exclusion is explicitly recited. Furthermore, references to "one embodiment" of the present invention are not intended to be interpreted as excluding the existence of additional embodiments that also incorporate the recited features.

Figure 1:
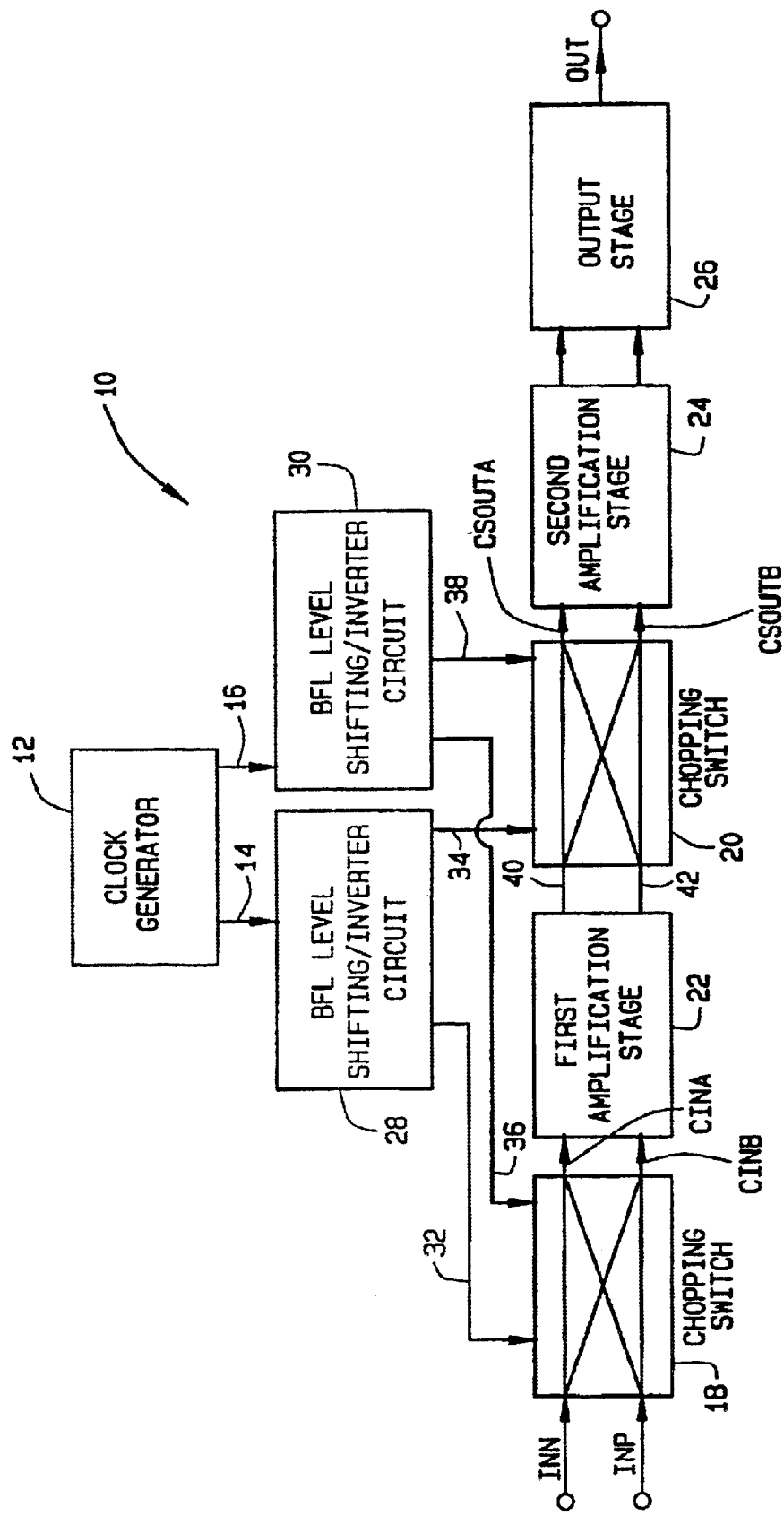
FIG. 1 is a simplified block diagram showing the topology of one embodiment of a depletion mode chopper-stabilized operational amplifier (op amp).

In one embodiment and referring to FIG. 1, a chopper-stabilized NMOS depletion mode operational amplifier circuit 10 is provided. A clock generator 12 develops clock signals 14, 16 that interface to chopping switches 18, 20 surrounding a first amplification stage 22. The chopping function provided by chopping switches 18, 20 modulates the offset of first amplification stage 22 to the clock frequency, which is outside a signal bandwidth of interest and thus easily filtered out. In one embodiment, at least one additional amplifier stage is present. In the illustrated embodiment, two additional amplifier stages 24 and 26 are present. Offsets in such additional amplifier stages 24, 26 are attenuated by at least the gain of first amplification stage 22. Each of the circuits shown is implemented utilizing NMOS depletion mode technology.

An interface between clock generator 12 and chopping switches 18 and 20 is provided by one or more buffered field effect transistor logic (BFL) level shifting/inverter circuits 28, 30. Two BFL level shifting circuits 28, 30 are provided for operational amplifier 10 to accommodate differential inputs INN and INP, which are controlled by different timing phases represented by clock signals 14, 16. (As used herein, either differential input signal INN or INP is considered an "input signal.") Due to the negative threshold voltages of field effect transistors (FETs) in NMOS depletion mode circuits, first BFL level shifting/inverter circuit 28 provides a first chopping signal 32 and a level shifted first chopping signal 34. Level shifted first chopping signal 34 is a replica of first chopping signal 32, but level shifted to voltages required for chopping switch 20. Similarly, second BFL level shifting/inverter circuit 30 provides a second chopping signal 36 and a level shifted second chopping signal 38. In the embodiment represented in FIG. 1, NMOS depletion mode chopping switch 18 is responsive to both first chopping signal 32 and second chopping signal 36 to chop a differential input signal (INN and/or INP) to first amplification stage 22. The chopped input signal thereby produced is shown as a differential signal, CINA and CINB. Similarly, NMOS depletion mode chopping switch 20 is responsive to level shifted first chopping signal 34 and level shifted second chopping signal 38 to chop the amplified chopped output signal of first amplification stage 22. The amplified chopped output signal is shown as another differential signal, 40 and 42. The result of the chopping performed by chopping switch 20 is that a chopper-stabilized output signal is produced. The chopper-stabilized output signal is shown as a differential signal, CSOUTA and CSOUTB. In one embodiment, this differential signal is itself provided as an output. However, in the embodiment of amplifier 10 represented in FIG. 1, further amplification of this signal takes place, and it is converted into a single-ended output OUT. Output OUT is a chopper-stabilized output signal produced in amplifier 10 as a result of the chopping process.

Figure 2:
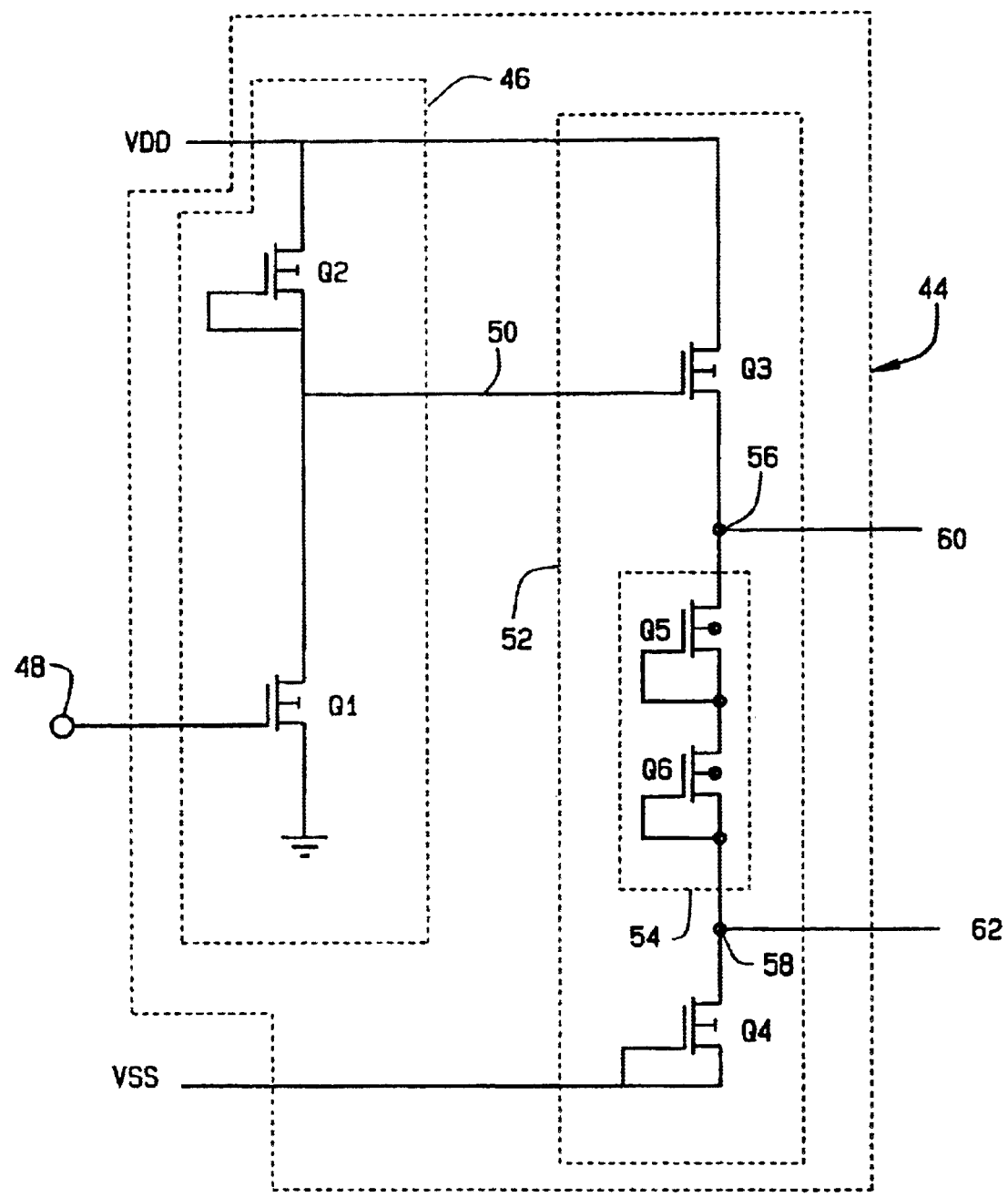
FIG. 2 is a schematic diagram of one embodiment of an NMOS depletion mode buffered field effect transistor logic (BFL) level shifter/inverter that suitable for use in the operational amplifier represented in FIG. 1.

One embodiment of an NMOS depletion mode circuit 44 suitable for use as BFL level shifting/inverter circuit 28 or 30 is shown schematically in FIG. 2. Circuit 44 comprises an NMOS depletion mode inverter circuit 46 having an input 48 for a clock signal (14 or 16 in FIG. 1). Inverter circuit 46, which is part of circuit 44, comprises field effect transistors (FETs) Q1 and Q2 and is responsive to an input signal at 48 to generate an inverted output 50. Inverted output 50 is applied to a buffered field effect transistor logic (BFL) stage 52. BFL stage 52 comprises FET Q3, which has a gate and a channel, and FET Q4, which also has a gate and a channel. In addition, a voltage drop circuit 54 is connected in series with the channels of FETs Q3 and Q4. In the circuit shown in FIG. 2, voltage drop circuit 54 includes one or more diode-connected FETs, for example, FETs Q5 and Q6. Output 60 is taken from node 56, between the channel of FET Q3 and voltage drop circuit 54, and output 62 is taken from node 58, between voltage drop circuit 54 and the channel of Q4.

Referring to FIGS. 1 and 2, BFL level shifting/inverter circuit 28, when implemented as circuit 44 shown in FIG. 2, connects clock signal 14 to input 48. Chopping signal 32 is produced at output 62, and level shifted chopping signal 34 is produced at output 60. Another circuit having the same topology as circuit 44 is also used as BFL level shifting/inverter circuit 30, with clock signal 16 connected to input 48. In this case, chopping signal 36 is produced at output 62, while level shifted chopping signal 38 is produced at output 60.

Figure 3:
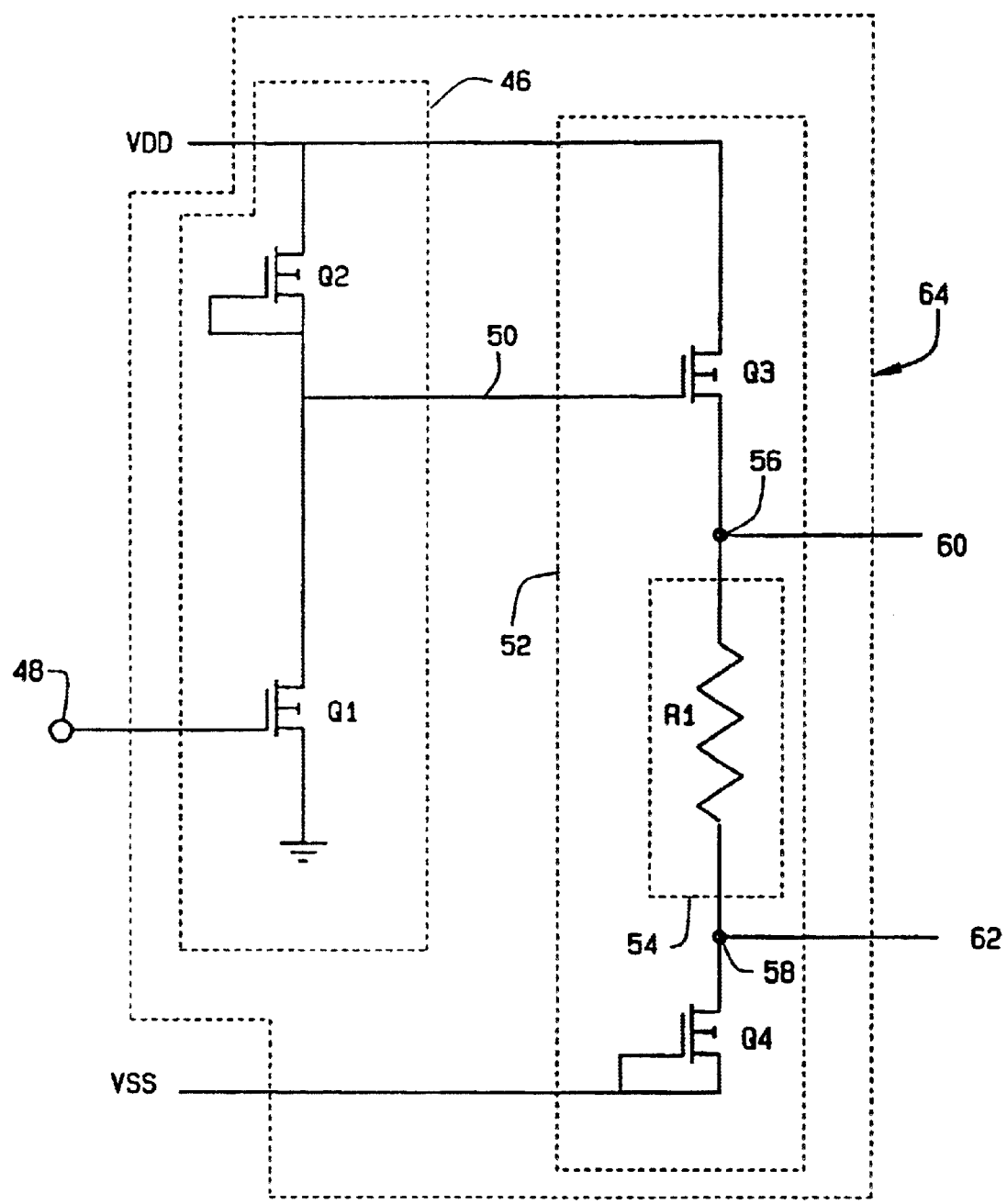
FIG. 3 is a schematic diagram of a second embodiment of an NMOS depletion mode buffered field effect transistor logic (BFL) level shifter/inverter that suitable for use in the operational amplifier represented in FIG. 1.

Another embodiment of an NMOS depletion mode inverter circuit 64 is represented by the schematic diagram shown in FIG. 3. Circuit 64 can be used as an alternative for circuit 44 of FIG. 2 in amplifier circuit 10 of FIG. 1 or in other circuits. Circuit 64 differs from circuit 44 in that the voltage drop circuit in circuit 64 is a resistor R1, which can readily be produced using the NMOS depletion mode process. This embodiment facilitates high reliability because a negative direct current (DC) bias is kept on all FETs (i.e., Q1, Q2, Q3, and Q4 of circuit 64) with respect to their respective sources. Either circuit 64 or circuit 44 are suitable for fabrication using SiC technology. Input 48 and outputs 60 and 62 of circuit 64 are used in the same manner as the corresponding inputs and outputs of circuit 44.

Figure 4:
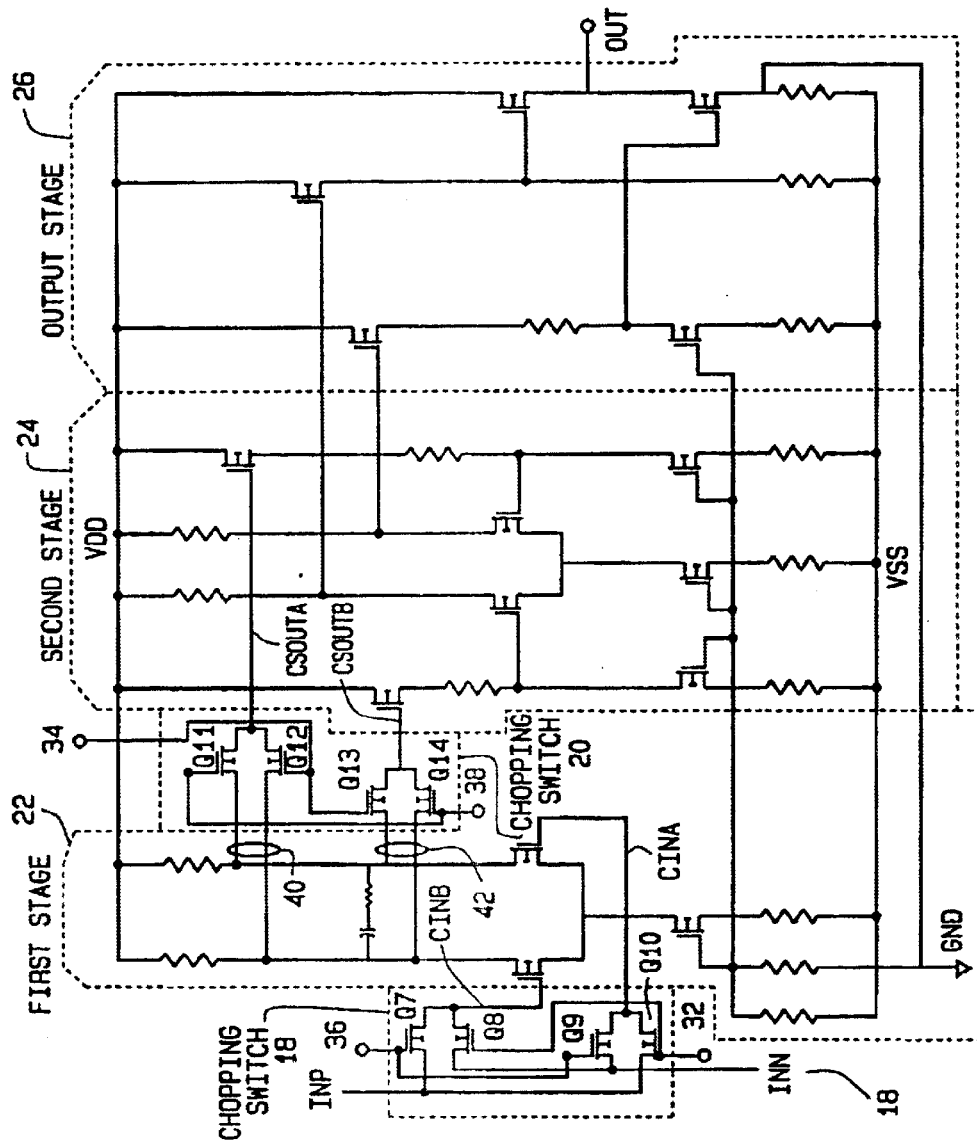
FIG. 4 is a schematic diagram of a portion of one embodiment of an NMOS depletion mode chopper-stabilized operational amplifier, excluding the clock generator shown in FIG. 1 and the NMOS depletion mode BFL level/shifter inverters shown in FIGS. 1 and 2.

Referring to FIG. 4, the remaining circuitry of chopper stabilized NMOS depletion mode operational amplifier 10 are conventional. In the topology shown in FIG. 4, chopping switch 18 has threshold voltages that are negative with respect to the drains and sources of (and thus, the channels of) FETs Q7, Q8, Q9, and Q10. Similarly, chopping switch 20 has threshold voltages that are negative with respect to the drains and sources of FETs Q11, Q12, Q13, and Q14. Differences in source potentials for switches 18 and 20 require level shifting of drive voltages applied to the gates of their respective FETs to turn the switches on and off. This level shifting is provided by BFL level shifting circuits 28 and 30 (not shown in FIG. 4). The use of either circuit 44 or 64 as a BFL level shifting circuit allows an inverter to drive both sets of chopping switches simultaneously without the use of additional level shifting circuitry. Offsets in amplifier 10 are removed dynamically so that offset drift and flicker noise are substantially reduced or minimized.

In one embodiment, amplifier circuit 10 is implemented in NMOS depletion mode silicon carbide (SiC) technology (i.e., fabricated on a silicon carbide substrate), and thus is a chopper-stabilized, silicon carbide NMOS depletion mode operational amplifier. In this embodiment, circuit 10 is capable of operation at much higher temperatures than is possible with conventional silicon or silicon on insulator (SOI) technologies. For example, SiC circuits are capable of operation at temperatures above 300 degrees Celsius. Thus, embodiments of amplifier 10 fabricated using SiC technology can be operated at temperatures over 300 degrees Celsius without cooling, and located at or near sensors in high-temperature environments. Noise pickup will also be reduced because, in such cases, circuit 10 can be located at a point much closer to the sensor than if cooling were required.

Although NMOS depletion mode SiC technology is especially suitable for use in conjunction with or in embodiments of the present invention, in other embodiments, other NMOS depletion mode technologies are used. However, the temperature limitations of such embodiments are dependent upon the technology used. As a result, not all such embodiments are suitable for use in high temperature applications.

While the invention has been described in terms of various specific embodiments, those skilled in the art will recognize that the invention can be practiced with modification within the spirit and scope of the claims.

What is claimed is:

1. A method for amplifying a signal comprising:

generating an input signal;

amplifying the input signal utilizing a chopper-stabilized, silicon carbide NMOS depletion made operational amplifier to produce an amplified output signal, the operational amplifier including a first NMOS depletion mode amplification stage and a second NMOS depletion mode amplification stage, the first stage and the second stage fabricated on the same silicon carbide substrate, wherein amplifying the input signal comprises chopping the input signal utilizing a first NMOS depletion mode chopping switch responsive to a first chopping signal to produce a first chopped input signal; and generating at least one opposite node of a resistor of an NMOS depletion mode buffered field effect transistor logic (BFL) level shifting/inverter circuit, the first chopping signal, and the level shifted first chopping signal in response to a clock signal.

2. A method in accordance with claim 1 wherein amplifying the input signal comprises amplifying the first chopped input signal utilizing an NMOS depletion mode amplifier stage to produce an amplified chopped output signal.

3. A method in accordance with claim 1 wherein amplifying the input signal comprises chopping the amplified chopped output signal utilizing an NMOS depletion mode amplifier responsive to a level shifted first chopping signal to produce a chopper-stabilized output signal.

4. An operational amplifier circuit comprising:

a first NMOS depletion mode amplification stage;

a first NMOS depletion mode chopping switch responsive to a first chopping signal to chop an input signal to said first amplification stage;

a second NMOS depletion mode chopping switch responsive to a level shifted first chopping signal to chop an output signal from said first amplification stage; and an NMOS depletion mode buffered field effect transistor logic (BFL) level shifting/inverter circuit responsive to a clock signal to generate said first chopping signal and said level shifted first chopping signal across a voltage dropping element.

5. A circuit in accordance with claim 4 wherein said first voltage dropping element comprises at least one diode-connected field effect transistor (FET).

6. A circuit in accordance with claim 4 wherein said voltage dropping element is a resistor, said NMOS depletion mode BFL level shifting/inverter circuit comprises a plurality or field effect transistors (FETs) each having a gate and an associated channel.

7. A circuit in accordance with claim 6 wherein said BFL level shifting/inverter circuit is configured to operate with negative direct current (DC) bias on each said gate with respect to each said associated channel.

8. An operational amplifier circuit comprising:

a first NMOS depletion mode amplification stage;

a first NMOS depletion mode chopping switch responsive to a first chopping signal to chop an input signal to said first amplification stage;

a second NMOS depletion mode chopping switch responsive to a level-shifted first chopping signal to chop an output signal from said first amplification stage; and and an NMOS depletion mode buffered field effect transistor logic (BFL) level shifting/inverter circuit responsive to a clock signal to generate said first chopping signal and said level shifted first chopping signal across a resistor;

and further wherein said first NMOS depletion mode amplification stage, first NMOS depletion mode chopping switch, second NMOS depletion mode chopping switch, and said NMOS depletion mode buffered field effect transistor logic (BFL) level shifting/inverter circuit are fabricated on the same silicon carbide substrate.

9. A circuit in accordance with claim 8 wherein said first chopping switch and said second chopping switch each comprise NMOS field effect transistor (FET) switches having a channel and a gate, and said NMOS field effect transistors have threshold voltages negative with respect to their respective channels.

10. A circuit in accordance with claim 8 further comprising a clock generator configured to produce said clock signal.

11. An operational amplifier circuit comprising:

a first NMOS depletion mode amplification stage having differential inputs and outputs;

a first NMOS depletion mode chopping switch responsive to a first chopping signal and a second chopping signal to chop a differential input signal to said first amplification stage, a second NMOS depletion mode chopping switch responsive to a level-shifted first chopping signal and a level shifted second chopping signal to chop an output signal from said first amplification stage;

a first NMOS depletion mode buffered field effect transistor logic (BFL) level shifting/inverter circuit responsive to a clock signal to generate said first chopping signal and said level shifted first chopping signal across a first resistor;

a second NMOS depletion mode buffered field effect transistor logic (BFL) level shifting/inverter circuit responsive to said clock signal to generate said second chopping signal and said level shifted second chopping signal across a second resistor; and a clock generator circuit configured to generate said clock signal.

12. A circuit in accordance with claim 11 fabricated on a silicon carbide substrate.

13. A circuit in accordance with claim 11 further comprising at least one additional stage of amplification responsive to said chopped output signal from said first amplification stage.

14. A circuit in accordance with claim 13 further comprising a sensor, wherein said first amplification stage is responsive to an output signal of said sensor chopped by said first NMOS depletion mode chopping switch.

* * * * *

UNITED STATES PATENT AND TRADEMARK OFFICE
CERTIFICATE OF CORRECTION

PATENT NO. : 6,788,136 B2 Page 1 of 1
DATED : September 7, 2004
INVENTOR(S) : Donald T. McGrath It is certified that error appears in the above-identified patent and that said Letters Patent is hereby corrected as shown below:

Column 5,
Line 9, delete "depletion made" and insert therefor -- depletion mode --.

Signed and Sealed this

Sixth Day of December, 2005

JON W. DUDAS
*Director of the United States Patent and Trademark Office*